United States Patent
Kawai

(10) Patent No.: US 9,402,318 B2
(45) Date of Patent: Jul. 26, 2016

(54) PRINTED WIRING BOARD

(71) Applicant: IBIDEN CO., LTD., Ogaki (JP)

(72) Inventor: Satoru Kawai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 23 days.

(21) Appl. No.: 14/465,969

(22) Filed: Aug. 22, 2014

(65) Prior Publication Data

US 2015/0053470 A1 Feb. 26, 2015

(30) Foreign Application Priority Data

Aug. 23, 2013 (JP) ................. 2013-173085

(51) Int. Cl.
*H05K 1/09* (2006.01)
*H05K 3/10* (2006.01)
*H05K 3/28* (2006.01)

(52) U.S. Cl.
CPC ............. *H05K 3/108* (2013.01); *H05K 3/285* (2013.01); *H05K 2201/09827* (2013.01); *H05K 2203/0307* (2013.01); *H05K 2203/0597* (2013.01)

(58) Field of Classification Search
CPC .............. H05K 2203/0307; H05K 2201/0367; H05K 2201/0373; H05K 1/0298; H05K 1/0313; H05K 3/108; H05K 3/285; H05K 2203/0597; H05K 2201/09827; H05K 3/383; H05K 2201/09218; H05K 3/4007; H05K 1/09
See application file for complete search history.

(56) References Cited

U.S. PATENT DOCUMENTS

| | | | | |
|---|---|---|---|---|
| 5,021,296 A * | 6/1991 | Suzuki | ................... | H05K 3/384 361/748 |
| 5,487,999 A * | 1/1996 | Farnworth | ........... | G01R 1/0466 216/18 |
| 2005/0102828 A1 * | 5/2005 | Suzuki | ................... | H01R 13/22 29/844 |
| 2005/0175826 A1 * | 8/2005 | Suzuki | ..................... | C25D 1/04 428/209 |
| 2006/0216484 A1 * | 9/2006 | Saita | ....................... | B32B 15/08 428/209 |
| 2009/0044971 A1 * | 2/2009 | Kataoka | ................. | H05K 3/244 174/257 |
| 2009/0183901 A1 * | 7/2009 | Kataoka | ............. | H01L 21/4846 174/257 |
| 2009/0211787 A1 * | 8/2009 | Kamei | ................. | G11B 5/4853 174/250 |
| 2009/0283497 A1 * | 11/2009 | Kondo | ................... | H05K 3/108 216/13 |
| 2010/0065322 A1 * | 3/2010 | Ogawa | ................. | H01L 21/563 174/262 |
| 2011/0240358 A1 * | 10/2011 | Nakai | .................... | H05K 3/108 174/268 |
| 2011/0260321 A1 * | 10/2011 | Pendse | .................... | H01L 24/16 257/737 |
| 2013/0180772 A1 * | 7/2013 | Inoue | .................... | H05K 1/111 174/263 |

FOREIGN PATENT DOCUMENTS

| | | |
|---|---|---|
| JP | 10-190224 A | 7/1998 |
| JP | 2005-150551 A | 6/2005 |

* cited by examiner

*Primary Examiner* — Steven T Sawyer
(74) *Attorney, Agent, or Firm* — Oblon, McClelland, Maier & Neustadt, L.L.P.

(57) ABSTRACT

A wiring board includes a first resin insulation layer, a conductive layer formed on the first insulation layer and including first and second conductive circuits formed adjacent to each other, and a second resin insulation layer formed on the first insulation layer and on the conductive layer such that the second insulation layer is filling a space between the first and second conductive circuits. The first and second conductive circuits are formed such that a distance between the first conductive circuit and the second conductive circuit is in a range of 10 μm or less at the first insulation layer, and each of the first and second conductive circuits has a bottom portion in contact with the first insulation layer and an upper portion on the bottom portion such that the upper portion has a roughened sidewall and the bottom portion has a sidewall which is not roughened.

12 Claims, 5 Drawing Sheets

PRINTED WIRING BOARD

CROSS-REFERENCE TO RELATED APPLICATIONS

The present application is based upon and claims the benefit of priority to Japanese Patent Application No. 2013-173085, filed Aug. 23, 2013, the entire contents of which are incorporated herein by reference.

BACKGROUND OF THE INVENTION

1. Field of the Invention

The present invention relates to a printed wiring board having a first conductive circuit and a second conductive circuit adjacent to the first conductive circuit. In such a printed wiring board, the distance between the first conductive circuit and the second conductive circuit is set at 10 μm or less, and a sidewall of the first conductive circuit and a sidewall of the second conductive circuit are partially roughened.

2. Description of Background Art

JP 2005-150551A, for example, describes a method for manufacturing a printed wiring board having fine-pitch conductive circuits. According to the manufacturing method of JP 2005-150551A, the width of a plating resist and the width of the space between adjacent plating resists are each set at less than 20 μm. JP H10-190224A describes a method for roughening the top surface and sidewalls of a conductive circuit. The entire contents of these publications are incorporated herein by reference.

SUMMARY OF THE INVENTION

According to one aspect of the present invention, a wiring board includes a first resin insulation layer, a conductive layer formed on the first resin insulation layer and including a first conductive circuit and a second conductive circuit formed adjacent to the first conductive circuit, and a second resin insulation layer formed on the first resin insulation layer and on the conductive layer such that the second resin insulation layer is filling a space between the first conductive circuit and the second conductive circuit. The first conductive circuit and the second conductive circuit are formed such that a distance between the first conductive circuit and the second conductive circuit is in a range of 10 μm or less at the first resin insulation layer, and each of the first conductive circuit and the second conductive circuit has a bottom portion in contact with the first resin insulation layer and an upper portion on the bottom portion such that the upper portion has a roughened sidewall and the bottom portion has a sidewall which is not roughened.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
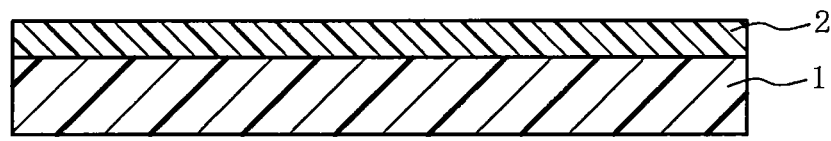
FIG. 1(a)-1(d) are cross-sectional views schematically showing a method for manufacturing a printed wiring board according to an embodiment of the present invention.

The embodiments will now be described with reference to the accompanying drawings, wherein like reference numerals designate corresponding or identical elements throughout the various drawings.

Figure 3A:
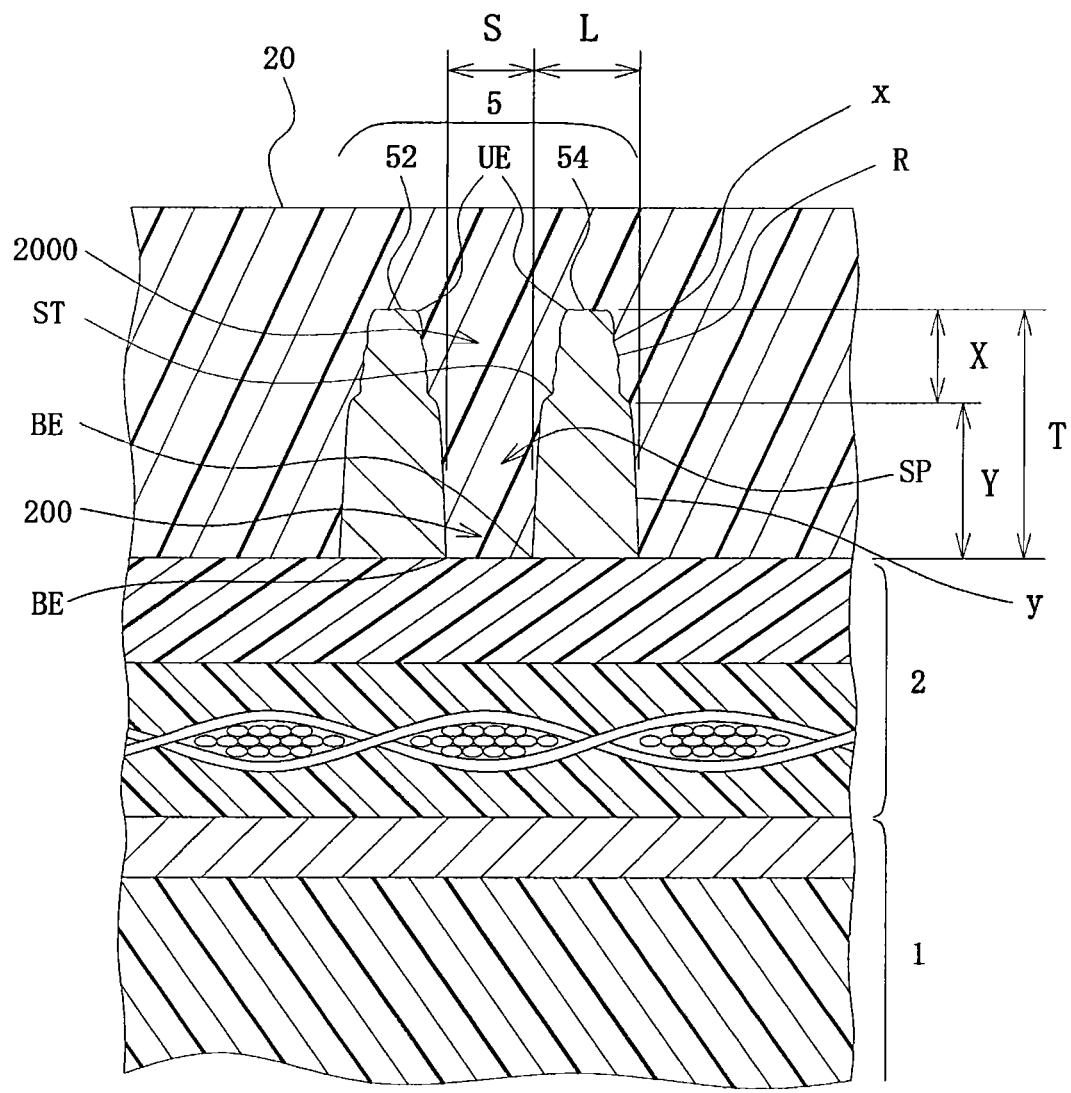
FIG. 3(A) is a cross-sectional view schematically showing the concept of a printed wiring board according to the embodiment.
Figure 3B:
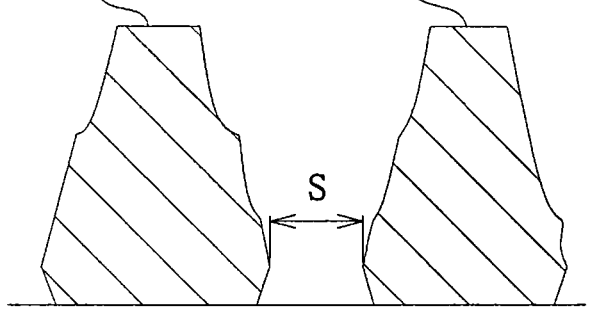
FIG. 3(B) is a view illustrating an example of the cross-sectional shape of conductive circuits after roughening treatment.
Figure 3C:
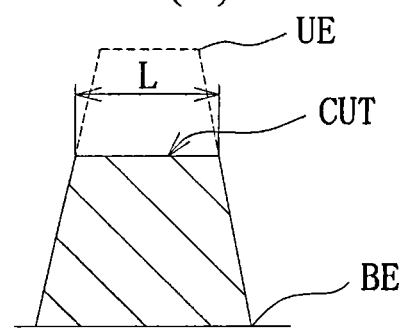
FIG. 3(C) is a view illustrating the state of a conductive circuit after roughening treatment.

The cross-sectional view in FIG. 3(A) shows part of a printed wiring board according to an embodiment of the present invention. The conductive circuit shown on the right in FIG. 3(A) is first conductive circuit 54, and the one adjacent to first conductive circuit 54 is second conductive circuit 52. Second conductive circuit 52 is shown on the left in FIG. 3(A). First conductive circuit 54 and second conductive circuit 52 are positioned parallel to each other. FIG. 3(A) is a view obtained by slicing the printed wiring board with a plane perpendicular to first conductive circuit 54 and second conductive circuit 52. Cross-sectional views shown in FIG. 3(B) and FIG. 3(C) are also obtained by slicing the printed wiring board with a plane perpendicular to the conductive circuits. In addition, those planes are perpendicular to the direction of progression in conductive circuits (direction of current flow).

Distance (S) shown in FIG. 3(A) is the distance of space (SP) between first conductive circuit 54 and second conductive circuit 52, and is 10 μm or less. Distance (S) corresponds to the length of first resin insulation layer 2 that is exposed between first conductive circuit 54 and second conductive circuit 52. In FIG. 3(A), distance (S) is the distance between first conductive circuit 54 and second conductive circuit 52 measured on first resin insulation layer 2. When the shapes of conductive circuits (54, 52) are those shown in FIG. 3(B), distance (S) is as indicated in FIG. 3(B). Then, space (SP) is filled with second resin insulation layer 20.

If distance (S) is 10 μm or less, it is difficult to fill space (SP) with second resin insulation layer 20. In addition, all sidewalls of conductive circuits are roughened as shown in JP H10-190224A. Roughened surfaces work as resistance. Roughened surfaces inhibit movement of second resin insulation layer 20. Thus, filling space (SP) with second resin insulation layer 20 is inhibited by the roughened surfaces. Therefore, when distance (S) is 10 μm or less and all sidewalls of conductive circuits are roughened, it is difficult to fill space (SP) with resin. If space (SP) is not filled with resin, a gap is formed between second resin insulation layer 20 and first resin insulation layer 2. Then, when the printed wiring board absorbs moisture, the moisture tends to collect in the gap. Such a circumstance will result in lower insulation resistance between first conductive circuit 54 and second conductive circuit 52.

Also, if a gap (void) exists between first resin insulation layer 2 and second resin insulation layer 20, which is the space between first conductive circuit 54 and second conductive circuit 52, the void expands due to heat generated when the printed wiring board is being manufactured or is in use.

Expansion of the void causes the gap to enlarge, and short-circuiting of first conductive circuit 54 and second conductive circuit 52 may occur.

An embodiment of the present invention is described by referring to FIG. 3(A). On first resin insulation layer 2, the printed wiring board of the embodiment has first resin insulation layer 2 and conductive layer 5. Conductive layer 5 has multiple conductive circuits (wiring patterns) that include first conductive circuit 54 (the conductive circuit on the right in FIG. 3(A)), and second conductive circuit 52 (the conductive circuit on the left in FIG. 3(A)). Distance (S) between first conductive circuit 54 and second conductive circuit 52 is 10 μm or less.

First conductive circuit 54 and second conductive circuit 52 each have a bottom surface that is in contact with first resin insulation layer 2. In addition, first conductive circuit 54 and second conductive circuit 52 each have a top surface opposite the bottom surface, a first side surface and a second side surface opposite the first side surface. The first side surface of first conductive circuit 54 faces the first side surface of second conductive circuit 52. Namely, the first side surface of second conductive circuit 52 is closer to first conductive circuit 54, and the second side surface of second conductive circuit 52 is farther from first conductive circuit 54. In FIG. 3(A), the right side surface of first conductive circuit 54 is its second side surface and the left side surface is its first side surface, whereas the right side surface of second conductive circuit 52 is its first side surface and the left side surface is its second side surface.

A first side surface has upper sidewall (x) (first upper sidewall) and lower sidewall (y) (first lower sidewall). Upper sidewall (x) is closer to the top surface, and lower sidewall (y) is closer to the bottom surface. A second side surface, top surface and upper sidewall (x) are roughened. Lower sidewall (y) is not roughened. The entire top surface and the entire second side surface are roughened. Sidewall (upper sidewall) (x), which is a portion from the top end to a middle point of a first side surface, is roughened, but sidewall (lower sidewall) (y), which is a portion from the bottom end to the middle point of the first side surface, is not roughened.

In addition, a first side surface is preferred to have level difference (ST) as shown in FIG. 3A. Level difference (ST) increases the distance between top end (UE) of the first side surface of first conductive circuit 54 and top end (UE) of the first side surface of second conductive circuit 52. Accordingly, it is easier to fill resin in space (SP). When a first side surface has a level difference, a portion of the side surface from top end (UE) to level difference (ST) is upper sidewall (x), and a portion of the side surface from level difference (ST) to bottom end (BE) is lower sidewall (y).

In FIG. 3(A), a conductive circuit positioned on the right side of first conductive circuit 54 is omitted, but distance (S) between the omitted right-side conductive circuit and first conductive circuit 54 exceeds 10 μm. In FIG. 3(A), a conductive circuit positioned on the left side of second conductive circuit 52 is omitted, but distance (S) between the omitted left-side conductive circuit and second conductive circuit 52 exceeds 10 μm. Since distance (S) exceeds 10 μm, even if the second side surface is roughened, the space between conductive circuits will be filled with resin.

When conductive layer 5 has a third conductive circuit to the other side of second conductive circuit 52 and when distance (S) between second conductive circuit 52 and the third conductive circuit is 10 μm or less, the second side surface of second conductive circuit 52 has second upper sidewall (x) and second lower sidewall (y). In such a case, the upper sidewall (second upper sidewall) (x) is roughened, but the lower sidewall (second lower sidewall) (y) of the second side surface is not roughened.

Namely, when distance (S) between adjacent conductive circuits is 10 μm or less, a roughened layer (roughened surface) (R) is not formed in a portion at the lower end of each of the opposing side surfaces (lower sidewall (y)). Thus, when uncured resin film is laminated on conductive layer 5 and hot-pressed so that the resin of the resin film is filled in space (SP) between conductive circuits (54, 52), resistance caused by roughened surfaces (R) on sidewalls of conductive circuits (54, 52) is reduced. Uncured resin material is filled all the way to the bottom end of space (SP). Thus, no gap is formed between second resin insulation layer 20 filled in space (SP) and first resin insulation layer 2 exposed by space (SP). Accordingly, insulation resistance and insulation reliability are enhanced between first and second conductive circuits (54, 52).

Since distance (S) is 10 μm or less, the amount of second resin insulation layer 200 formed between opposing lower sidewalls (y) (second resin insulation layer between lower sidewalls (y)) is small. Thus, even when a printed wiring board undergoes heat cycles, the degree of deformation is small in second resin insulation layer 200, which is positioned between lower sidewalls (y). Therefore, even without roughened surface (R) on a sidewall (y), second resin insulation layer 200 is unlikely to peel away from the lower sidewall (y).

As shown in FIG. 3(A), a first side surface substantially tapers as the line width of a conductive circuit increases from its top surface toward the bottom surface. First conductive circuit 54 and second conductive circuit 52 have an approximately trapezoidal shape. Therefore, a greater amount of second resin insulation layer 2000 is formed between opposing upper sidewalls (x). If the upper sidewalls (x) have roughened surfaces (R), second resin insulation layer 2000 is unlikely to peel away from the first side surfaces.

First resin insulation layer 2 is formed using a thermosetting resin. First resin insulation layer 2 may contain inorganic particles of silica or the like. First resin insulation layer 2 may contain reinforcing material such as glass cloth. First resin insulation layer 2 may contain inorganic particles and reinforcing material.

Conductive layer 5 is formed on first resin insulation layer 2. Conductive layer 5 is formed using a semi-additive method.

FIG. 1(a) shows core substrate 1 and first resin insulation layer 2 on core substrate 1.

Figure 1B:
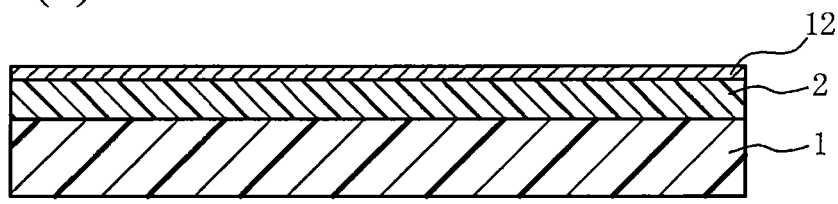

As shown in FIG. 1(b), electroless copper-plated film 12 is formed as a seed layer on first resin insulation layer 2. The thickness of electroless copper-plated film 12 is 0.1~5 μm.

Figure 1C:
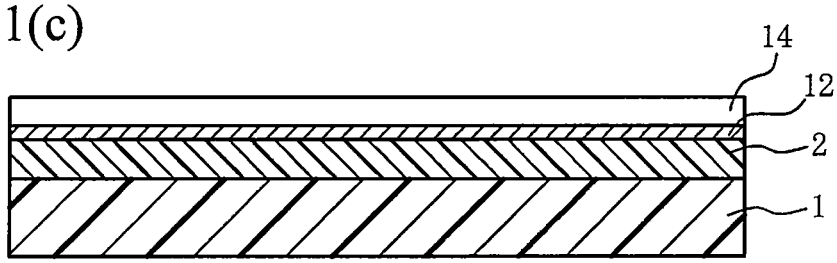
Figure 1D:
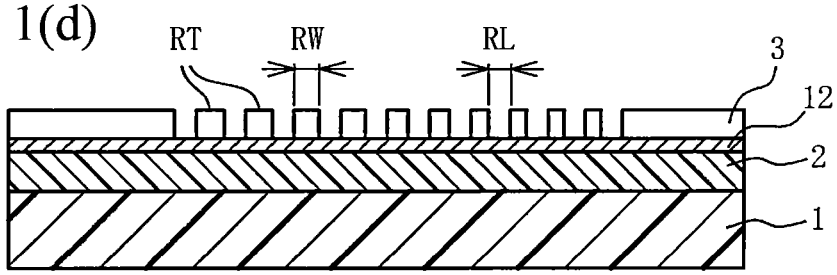

Next, plating resist 3 is formed on seed layer (electroless copper-plated film) 12 (FIG. 1(d)).

More specifically, 20~40 μm-thick dry film 14 is laminated on the seed layer (FIG. 1(c)). Then, dry film 14 is exposed to light via a photomask having a predetermined pattern. After that, a developing process is conducted to form plating resist 3 for forming multiple conductive circuits of conductive layer 5 (FIG. 1(d)).

As shown in FIG. 1(d), plating resist 3 includes a resist pattern (RT) having width (RW) of less than 10 μm. Width (RW) of resist pattern (RT) is what is measured on the seed layer. Since the width between conductive circuits may increase during the later-described step for removing the seed layer, width (RW) of resist pattern (RT) is preferred to be 9.8 μm or less.

Next, electrolytic plated film (electrolytic copper-plated film) 13 is formed on portions of the seed layer exposed by plating resist 3 (FIG. 2(*a*)). The film thickness of the electrolytic plated film is 10~20 μm.

Then, plating resist 3 is removed using NaOH or amine (FIG. 2(*b*)).

Moreover, seed layer (electroless copper-plated film) 12 between portions of electrolytic plated film 13 is removed using, for example, a sulfuric acid-hydrogen peroxide solution. Accordingly, conductive layer 5 is formed, being made up of electroless copper-plated film 12 and electrolytic copper-plated film 13 on electroless copper-plated film 12 (FIG. 2(*c*)).

Next, etching (roughening treatment) is conducted on conductive layer 5. Of the multiple conductive circuits of conductive layer 5, only the specified portions of the specified conductive circuits are roughened.

Namely, when conductive layer 5 has a first conductive circuit and a second conductive circuit adjacent to the first conductive circuit, and the distance between the first conductive circuit and its adjacent second conductive circuit is 10 μm or less, only the specified portion of the sidewalls of the first conductive circuit facing the second conductive circuit is roughened. The specified portion indicates a portion of the sidewall positioned within a predetermined distance from the top surface of the conductive circuit. Roughening treatment is conducted so as to form a roughened surface on a specified portion while avoiding forming a roughened surface on the rest of the side surface. The top surface of the conductive circuit is roughened.

On the other hand, if the distance between adjacent conductive circuits exceeds 10 μm, the side surfaces of opposing conductive circuits are entirely roughened.

Examples of an etching solution for forming roughened surfaces are a mixed solution of sulfuric acid and hydrogen peroxide, etching solutions containing organic acid and copper complex, sodium-persulfate solutions and the like.

"MECetchBOND" made by Mec Co., Ltd. is especially preferred as an etching solution. Etching is preferred to be conducted using brand name "MECetchBOND STZ-3100" made by Mec and under the following etching conditions (concentration, method, temperature and the like). Also, the surface roughness (arithmetic mean surface roughness) of the roughened surfaces formed by such etching is preferred to be 0.15~0.25 μm.

Etching Conditions
  Concentration: copper concentration 17.5 g/L
  Method: spraying or immersion in an etching solution
  Temperature: 25° C. (20~30° C.)
  Time: 20~80 sec.

As a method for roughening specified portions (upper sidewalls) of side surfaces of conductive circuits, a spraying or immersion method may be used. When distance (S) is 10 μm or less, the etching solution does not circulate well or does not circulate at all in space (SP)). Thus, the etching material is consumed on the upper portion of space (SP). The etching material is consumed for forming upper sidewalls (x). Distance (X) for the specified portion is adjustable by modifying the concentration of an etching solution, processing time, pressure for spraying and the like. To form lower sidewalls (y), the concentration of an etching solution is preferred to be low. Also, the etching time is preferred to be short, and the pressure for spraying is preferred to be low. If distance (S) exceeds 10 μm, the etching solution circulates well in space (SP), thus the side surfaces will be entirely roughened.

According to such etching treatment, line width (L) of a conductive circuit increases from its top surface toward the bottom. Line width (L) of a conductive circuit is the width of a cut surface (CUT) obtained by cutting a conductive circuit with a plane substantially parallel to the bottom surface of the conductive circuit as shown in FIG. 3(C). Namely, a conductive circuit with a surface roughened by etching treatment is formed in such a way that its line width increases gradually from its top surface toward its bottom surface. Especially, when distance (S) is 10 μm or less, since the difference in the etching amount is great in the upper and lower portions of a conductive circuit, level difference (ST) tends to be formed between upper sidewall (x) and lower sidewall (y). Also, if distance (S) exceeds 10 μm, line width (L) increases substantially straightforward from the top surface toward the bottom surface. The sidewall at the level difference (ST) portion is preferred to be roughened.

Namely, according to the present embodiment, when distance (S) is 10 μm or less, etching conditions are set so that a roughened surface is formed only in specified portions of the side surfaces of opposing conductive circuits with space (SP) between them. When distance (S) exceeds 10 μm, the side surfaces of opposing conductive circuits with space (SP) between them are entirely roughened.

Figure 4:
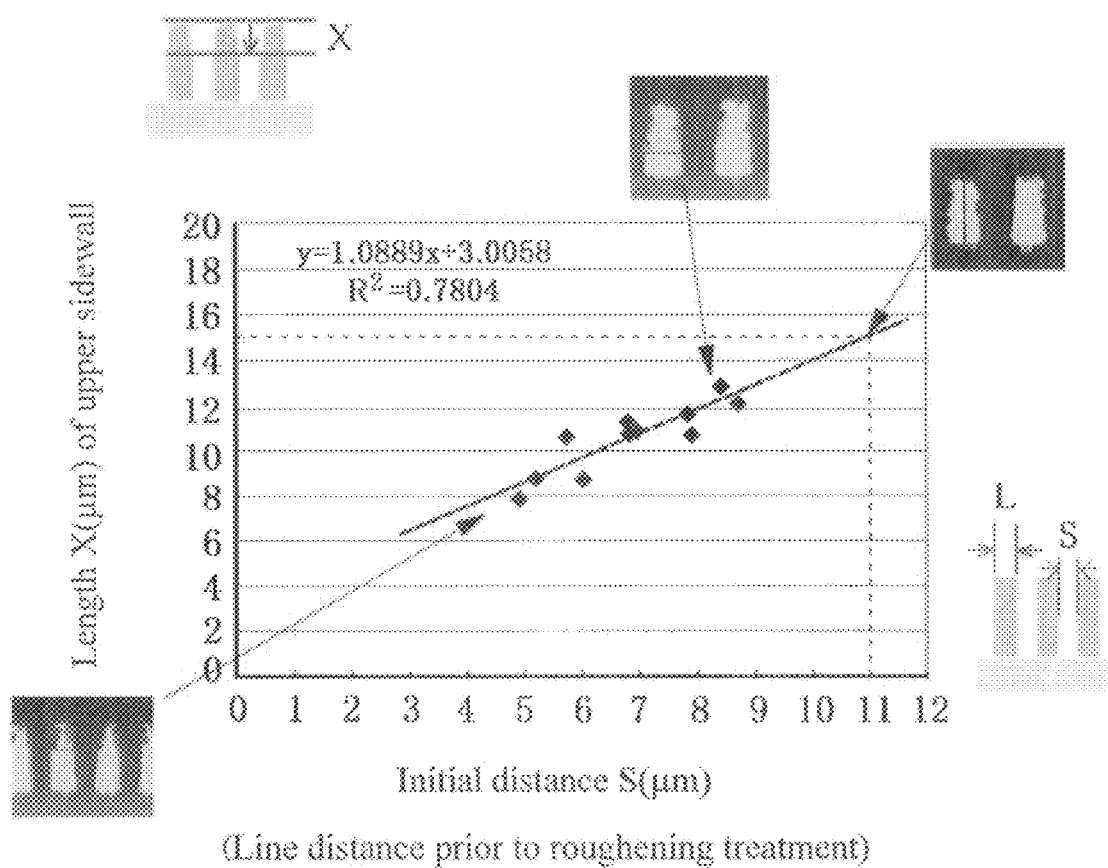
FIG. 4 is a graph regarding adjacent wiring patterns, showing the relationship between the line distance prior to roughening treatment and the length of the upper sidewall.

Also, when distance (S) is 10 μm or less and upper sidewall (x) is formed by etching, there is a relationship between distance (S) and length (X) of upper sidewall (x). The smaller the distance (S) is, the shorter is length (X) of upper sidewall (x). FIG. 4 shows such a relationship. Thickness (T) of conductive circuits is approximately 15 μm in FIG. 4. Distance (S) and length (X) of upper sidewall (x) are substantially in proportion to each other.

As shown in FIG. 3(A), when the thickness of conductive circuits is set as (T), length (X) of upper sidewall (x) is preferred to be in a range of T/3~2T/3. Namely, the sidewall of a conductive circuit is made up of upper sidewall (x) with a predetermined length and of lower sidewall (y), which is the rest of the sidewall. Lower sidewall (y) is not roughened. Here, (length (Y) of lower sidewall (y))=(thickness (T) of a conductive circuit)−(length (X) of upper sidewall (x)). Thus, when uncured resin for forming second resin insulation layer 20 is filled in space (SP), roughened surfaces cause resistance, but the impact from the roughened surfaces is small since lower sidewall (y) is not roughened in the present embodiment. Accordingly, space (SP) is fully filled with the resin of second resin insulation layer 20. Space (SP) is completely filled with second resin insulation layer 20. Therefore, no gap is formed on the interface between second resin insulation layer 20 and first resin insulation layer 2. Even if distance (S) is 10 μm or less, first and second resin insulation layers (2, 20) are adhered to each other. Also, second resin insulation layer 20 and sidewalls of conductive circuits (52, 54) are adhered to each other. Accordingly, even if distance (S) is 10 μm or less, peeling is unlikely to occur between first and second resin insulation layers (2, 20) and between second resin insulation layer 20 and conductive circuits (52, 54).

Second resin insulation layer 20 is formed with the same material as for first resin insulation layer 2. It is preferred that first resin insulation layer 2 contain reinforcing material such as glass cloth and that second resin insulation layer 20 contain no reinforcing material. If second resin insulation layer 20 contains reinforcing material, it is difficult to fill resin in space (SP). If first resin insulation layer 2 contains reinforcing material, it is easier to set distance (S) to be 10 μm or less in conductive layer 5 formed on first resin insulation layer 2, because first resin insulation layer 2 has high rigidity. Second resin insulation layer 20 may also contain reinforcing material. When resin is filled in space (SP), pressure can be applied uniformly.

Moreover, when first and second resin insulation layers (2, 20) contain inorganic particles, the average particle diameter is preferred to be 0.5 μm or less. If the particle diameter is 0.5 μm or less, it is easier to fill space (SP) of the present embodiment with the resin containing such particles.

First and second resin insulation layers (2, 20) are formed by coating a liquid-type resin or by laminating a sheet-type resin. Lamination is preferred.

A second conductive layer 6, the same as conductive layer 5, may be formed on second resin insulation layer 20. In such a case, the thickness of second resin insulation layer 20 between the bottom surface of the second conductive layer 6 and the top surface of conductive layer 5 (interlayer thickness) is preferred to be smaller than the thickness of conductive layer 5. If the interlayer thickness is thin, the degree of resin deformation during heat cycles is reduced. Thus, even when distance (S) is 10 μm or less and the side surface of a conductive circuit has a lower sidewall (y), resin is unlikely to peel away from the conductive circuit during heat cycles.

In the present embodiment, a solder-resist layer having openings may also be formed on the second conductive layer 6. A multilayer printed wiring board is obtained by forming solder bumps in the openings of the solder-resist layer.

In the present embodiment, a solder-resist layer having openings may also be formed on the second conductive layer. A multilayer printed wiring board is obtained by forming solder bumps in the openings of the solder-resist layer.

In the following, a method for manufacturing a printed wiring board according to an embodiment is described. In the embodiment, a thermosetting resin containing epoxy resin is used for first and second resin insulation layers (2, 20). For example, ABF film made by Ajinomoto Fine-Techno Co., Inc. is used.

(1) First resin insulation layer 2 is formed (FIG. 1(a)). First resin insulation layer 2 is formed on support sheet 1 or core substrate 1, for example. First resin insulation layer 2 may be an insulation layer shown in FIG. 2(c) of JP 2000-323613A, or a resin insulation layer shown in FIG. 2(b) of JP 2000-260905A, for example. The entire contents of JP 2000-260905A are incorporated herein by reference.

(2) On first resin insulation layer (first interlayer resin insulation layer) 2, seed layer 12 is formed by electroless plating, sputtering or the like (FIG. 1(b)). In the present embodiment, seed layer 12 is made of copper. The thickness of seed layer 12 is preferred to be approximately 0.1~2.0 μm. The top surface of the first resin insulation layer may be roughened prior to forming seed layer 12.

(3) Plating resist 3 is formed on seed layer 12 (FIG. 1(d)). Dry film 14 is laminated on seed layer 12 (FIG. 1(c)). The thickness of dry film 14 is 20 μm to 40 μm. Dry film 14 is exposed to light via a photomask having a predetermined pattern. Then, dry film 14 is developed and plating resist 3 is formed (FIG. 1(d)). Plating resist 3 includes resist pattern (RT) having width (RW) of less than 10 μm.

In the present embodiment, 10 resist patterns (RT) are arrayed parallel to each other. Widths (RW) of the 10 resist patterns (RT) are 10.8 μm, 10.8 μm, 9.8 μm, 9.8 μm, 7.8 μm, 7.8 μm, 5.8 μm, 5.8 μm, 4.8 μm and 4.8 μm arrayed in that order. Distance (RL) of adjacent resist patterns (RT) is 8.2 μm.

(4) Next, electrolytic plating is performed using seed layer 12 as a lead. Electrolytic plated film 13 is formed on portions of seed layer 12 exposed from plating resist 3 (FIG. 2(a)). The film thickness of electrolytic plated film 13 is 7~15 μm.

Figure 2A:
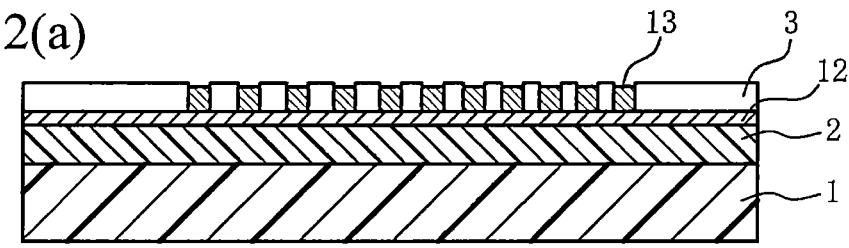
FIG. 2(a)-2(d) are cross-sectional views schematically showing the method for manufacturing a printed wiring board according to the embodiment.
Figure 2B:
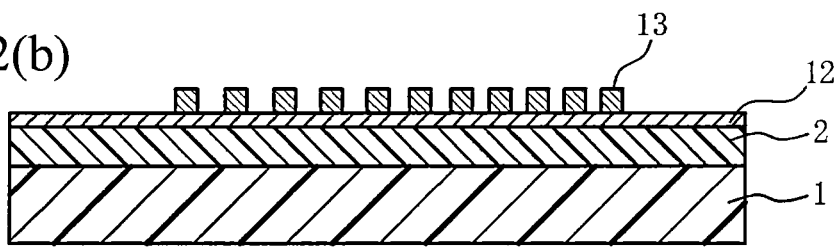
Figure 2C:
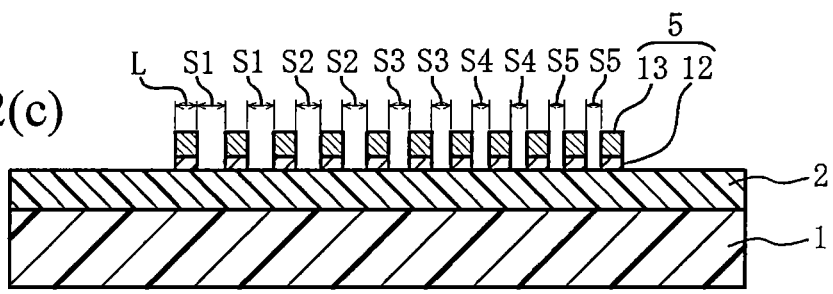
Figure 2D:
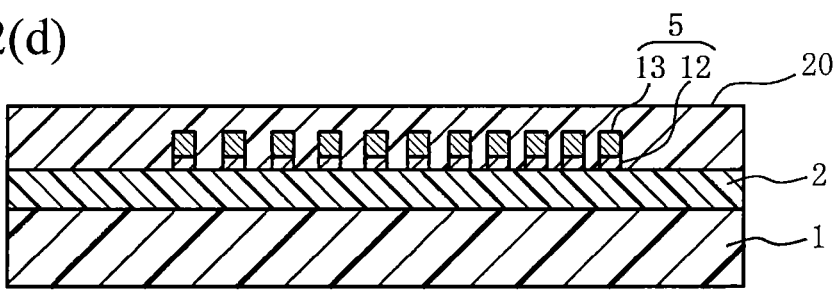

(5) Plating resist 3 between portions of electrolytic plated film 13 is removed using a sodium hydroxide solution (FIG. 2(b)). Then, seed layer 12 exposed from electrolytic plated film 13 is removed by etching. Conductive layer 5 made of seed layer 12 and electrolytic plated film 13 is formed (FIG. 2(c)). When seed layer 12 is removed, approximately 0.1 μm of the side surface of a conductive circuit is also removed. Therefore, the conductive layer of the present embodiment has 11 conductive circuits having line width (L) of 8 μm. The thickness (height) of conductive layer 5 is 15 μm, and distances (S) of adjacent conductive circuits are S1=11 μm, S2=10 μm, S3=8 μm, S4=6 μm and S5=5 μm. Electrolytic plated film 13 and seed layer 12 are preferred to be made of copper. When thickness (T) of a first conductive circuit and line width (L) on the bottom surface of the first conductive circuit are set in a ratio (aspect ratio T/L) of 2 or less, and its side surface has a lower sidewall, the space (the space between a first conductive circuit and a second conductive circuit) is filled with resin.

(6) Next, conductive layer 5 is roughened using an etching solution described in JP 2000-282265A. The entire contents of this publication are incorporated herein by reference. Etching is conducted by immersing the substrate having conductive layer 5 in the etching solution. An example of the etching solution and etching conditions is shown below.

Etching Solution and Etching Conditions
Sulfuric acid: 50 g/L
Hydrogen peroxide: 40 g/L
5-aminotriazole: 1 g/L
Phosphorous acid: 1 g/L
Temperature: 20° C.
Immersion time: 10 sec.

The substrate is washed with water after the etching.

In JP 2000-282265A, a copper-clad laminate is etched. Thus, the entire surface of the copper foil is roughened. By contrast, side surfaces of conductive circuits are roughened in the embodiment. In the embodiment, since distance (S) is 10 μm or less, the etching solution hardly reaches the top surface of the first resin insulation layer in space (SP). In addition, each concentration and the etching time are set at the lower limit, and only the upper portion of a sidewall of a conductive circuit is roughened. Accordingly, conductive circuits are obtained to have the shape shown in FIG. 3(A). By changing the concentration of the etching solution, treatment time and treatment method, length (X) of upper sidewall (x) can be adjusted. For example, by controlling the amount of etching described in JP 2000-282265A, the length of the upper sidewall can be adjusted.

(7) Resin film for a second resin insulation layer is laminated on conductive layer 5. The resin film is a B-stage film containing epoxy resin and a curing agent. In addition, the thickness of the resin film is approximately 30 μm. Then, using a vacuum laminator, the resin of the resin film is filled in space between conductive circuits.

Conditions for Vacuum Lamination
Temperature: 50° C. to 150° C.
Pressure: 5 kg/cm$^2$ Next, the resin film is cured and second resin insulation layer 20 is formed on first resin insulation layer 2 and on conductive layer 5 (FIG. 2(d)). Second resin insulation layer 20 fills space (SP).

Figure 5:
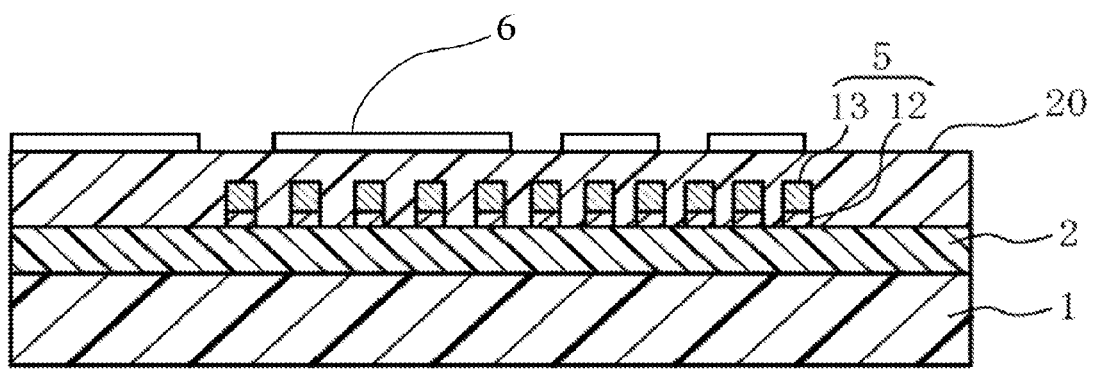
FIG. 5 is a view illustrating a second conductive layer formed on second resin insulation layer a printed wiring board.

Steps (2)~(6) above are repeated, and a second conductive layer 6 (shown in FIG. 5) is formed on second resin insulation layer 20.

After the above, a solder-resist layer (not shown) having openings is formed on second resin insulation layer 20 and on the second conductive layer 6. By forming solder bumps on portions of the second conductive layer 6 exposed from the openings of the solder-resist layer, a multilayer printed wiring board is obtained. By forming via conductors penetrating through second resin insulation layer 20, the second conductive layer 6 and the first conductive layer are connected. A method for forming via conductors is described in JP 2000-260905A, for example. The entire contents of this publication are incorporated herein by reference.

If the distance (L) between adjacent conductive circuits is less than 20 µm, insulation reliability of adjacent conductive circuits tends to be lowered.

For higher functionality and faster signal processing, miniaturization of wiring boards and finer pitch of wiring patterns may be sought.

A printed wiring board according to an embodiment of the present invention exhibits higher insulation reliability even when the space between adjacent conductive circuits is 10 µm or less.

A printed wiring board according to an embodiment of the present invention has the following: a first resin insulation layer; on the first resin insulation layer, a conductive layer that includes a first conductive circuit and a second conductive circuit adjacent to the first conductive circuit; and on the first resin insulation layer and on the conductive layer, a second resin insulation layer that fills space between the first conductive circuit and the second conductive circuit. In such a printed wiring board, the first conductive circuit has a bottom surface touching the first resin insulation layer, a top surface opposite the bottom surface, a first side surface closer to the second conductive circuit, and a second side surface opposite the first side surface; the second conductive circuit has a bottom surface touching the first resin insulation layer, a top surface opposite the bottom surface, a first side surface closer to the first conductive circuit, and a second side surface opposite the first side surface; the distance on the first resin insulation layer between the first conductive circuit and the second conductive circuit is 10 µm or less; the first side surface of the first conductive circuit and the first side surface of the second conductive circuit each have an upper sidewall closer to the top surface and a lower sidewall closer to the bottom surface; and the upper sidewalls are roughened whereas the lower sidewalls are not roughened.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising: a first resin insulation layer; a conductive layer formed on the first resin insulation layer and comprising a first conductive circuit and a second conductive circuit formed adjacent to the first conductive circuit such that each of the first conductive circuit and the second conductive circuit has a bottom portion in contact with the first resin insulation layer and an upper portion on the bottom portion; and a second resin insulation layer formed on the first resin insulation layer such that the second resin insulation layer is covering top end portions of the first conductive circuit and second conductive circuit and filling a space between the first conductive circuit and the second conductive circuit, wherein the first conductive circuit and the second conductive circuit are formed such that a distance between the first conductive circuit and the second conductive circuit is in a range of 10 um or less at the first resin insulation layer, each of the first conductive circuit and the second conductive circuit is formed such that the upper portion has a roughened sidewall and the bottom portion has a sidewall which is not roughened, the roughened sidewall of each of the first conductive circuit and the second conductive circuit has a length in a range of T/3 to 2T/3, Where T is a thickness of the first conductive circuit, and each of the first conductive circuit and the second conductive circuit has a line width increasing towards the first resin insulation layer.

2. A wiring board according to claim 1, wherein the first conductive circuit has an aspect ratio T/L in a range of 2 or less, where L represents a line width of the first conductive circuit at the first resin insulation layer.

3. A wiring board according to claim 1, further comprising: a second conductive layer formed on the second resin insulation layer such that a minimum distance between the conductive layer and the second conductive layer is smaller than a thickness of the first conductive circuit.

4. A wiring board according to claim 1, wherein each of the first conductive circuit and the second conductive circuit is formed such that a level difference is formed between the bottom portion and the upper portion.

5. A wiring board according to claim 1, wherein each of the first conductive circuit and the second conductive circuit has an aspect ratio T/L in a range of 2 or less, where L represents a line width of the first conductive circuit at the first resin insulation layer.

6. A wiring board according to claim 2, wherein each of the first conductive circuit and the second conductive circuit is formed such that a level difference is formed between the bottom portion and the upper portion.

7. A wiring board according to claim 3, wherein the first conductive circuit has an aspect ratio T/L in a range of 2 or less, where L represents a line width of the first conductive circuit at the first resin insulation layer.

8. A wiring board according to claim 3, wherein the first conductive circuit has an aspect ratio T/L in a range of 2 or less, where L represents a line width of the first conductive circuit at the first resin insulation layer.

9. A wiring board according to claim 4, further comprising: a second conductive layer formed on the second resin insulation layer such that a minimum distance between the conductive layer and the second conductive layer is smaller than a thickness of the first conductive circuit.

10. A wiring board according to claim 5, further comprising: a second conductive layer formed on the second resin insulation layer such that a minimum distance between the conductive layer and the second conductive layer is smaller than a thickness of the first conductive circuit and a thickness of the second conductive circuit.

11. A wiring board according to claim 5, wherein each of the first conductive circuit and the second conductive circuit is formed such that a level difference is formed between the bottom portion and the upper portion.

12. A wiring board according to claim 9, wherein each of the first conductive circuit and the second conductive circuit has an aspect ratio T/L in a range of 2 or less, where L represents a line width of the first conductive circuit at the first resin insulation layer.

* * * * *